(12) United States Patent
Kim

(10) Patent No.: US 9,589,662 B2
(45) Date of Patent: Mar. 7, 2017

(54) RESISTIVE MEMORY DEVICE WITH VARIABLE CELL CURRENT AMPLIFICATION

(71) Applicant: SK hynix Inc., Gyeonggi-do (KR)

(72) Inventor: Yeon-Uk Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 18 days.

(21) Appl. No.: 14/486,441

(22) Filed: Sep. 15, 2014

(65) Prior Publication Data

US 2015/0287473 A1 Oct. 8, 2015

(30) Foreign Application Priority Data

Apr. 4, 2014 (KR) ........................ 10-2014-0040558

(51) Int. Cl.
 *G11C 17/18* (2006.01)
 *G11C 17/16* (2006.01)
(52) U.S. Cl.
 CPC ............ *G11C 17/18* (2013.01); *G11C 17/165* (2013.01)
(58) Field of Classification Search
 CPC .................................................... G11C 17/18
 USPC ........................................................ 365/96
 See application file for complete search history.

(56) References Cited

U.S. PATENT DOCUMENTS

| 6,798,252 | B2 * | 9/2004 | Ekkart et al. .................... 327/53 |
| 7,269,047 | B1 * | 9/2007 | Fong ........................ G11C 7/08 365/104 |
| 7,764,531 | B2 * | 7/2010 | Aipperspach .......... G11C 17/16 365/202 |
| 8,259,515 | B2 * | 9/2012 | Bedeschi ............ G11C 11/5678 365/148 |
| 8,923,085 | B2 * | 12/2014 | Chung ................... G11C 17/16 365/148 |
| 9,460,807 | B2 * | 10/2016 | Chung ................. G11C 17/165 |
| 2005/0111261 | A1 * | 5/2005 | Lee ........................ G11C 16/28 365/185.21 |
| 2007/0247892 | A1 * | 10/2007 | Egerer ......................... 365/148 |
| 2008/0159042 | A1 * | 7/2008 | Bertin .................... B82Y 10/00 365/225.7 |
| 2008/0316789 | A1 * | 12/2008 | Fredeman .............. G11C 17/16 365/96 |
| 2011/0235397 | A1 * | 9/2011 | Sasaki .................... G11C 16/24 365/148 |
| 2013/0221995 | A1 * | 8/2013 | Hung ..................... G01R 27/08 324/705 |
| 2013/0279282 | A1 * | 10/2013 | Kim ....................... G11C 17/16 365/207 |
| 2014/0043928 | A1 * | 2/2014 | Lee .............................. 365/208 |

FOREIGN PATENT DOCUMENTS

| KR | 100301807 | 9/2001 |
| KR | 1020150067570 | 6/2015 |

* cited by examiner

*Primary Examiner* — Anthan Tran
*Assistant Examiner* — Mushfique Siddique
(74) *Attorney, Agent, or Firm* — IP & T Group LLP

(57) ABSTRACT

A resistive memory device includes a resistive memory cell whose resistance value varies based on a logic value of data stored therein, a current amplification block suitable for amplifying a current flowing through the resistive memory cell by N times, where N is a natural number greater than 1, and a sensing block suitable for sensing the data based on the amplified current.

13 Claims, 5 Drawing Sheets

RESISTIVE MEMORY DEVICE WITH VARIABLE CELL CURRENT AMPLIFICATION

CROSS-REFERENCE TO RELATED APPLICATIONS

The present application claims priority of Korean Patent Application No, 10-2014-0040558, filed on Apr. 4, 2014, which is incorporated herein by reference in its entirety.

BACKGROUND

1. Field

Various embodiments of the present invention relate to a resistive memory device, and more particularly, to a read operation of a resistive memory device.

2. Description of the Related Art

Generally, since data programmed in a laser fuse may be determined by whether or not the laser fuse is cut by a laser, a laser fuse is programmable only in a wafer state. However a laser fuse is not programmable after the wafer is packaged.

An electrical fuse, hereinafter, referred to as an e-fuse, is used to overcome such limitations of the laser fuse. The e-fuse uses a transistor that stores data based on the change in the resistance between a gate and a drain/source of the transistor.

FIG. 1 is a diagram illustrating an e-fuse formed of a transistor operating as a resistor or a capacitor.

Referring to FIG. 1, the e-fuse includes a transistor T having a gate G and a drain/source D/S to which a ground voltage is supplied.

When a power source voltage, which is tolerable to the transistor T, is applied to the gate G, the e-fuse operates as a capacitor C. Thus, there is no current flowing between the gate G and the drain/source D/S. However, when a high voltage that is intolerable to the transistor T is applied to the gate G, a gate oxide of the transistor T is broken that shorts the gate G and the drain/source D/S from each other, thus the e-fuse operates as a resistor R. Accordingly, a current flows between the gate G and the drain/source D/S of the e-fuse. The data of the e-fuse is recognized by the resistance value between the gate G and the drain/source D/S.

FIG. 2 is a diagram illustrating a memory device including an e-fuse, that is, a resistive memory element.

Referring to FIG. 2, the memory device includes a resistive memory element M, a data line DL, a load 210 and a sense amplifier 220. Hereinafter, an operation of programming the resistive memory element M and an operation of reading data stored in the resistive memory element M are described.

During a program operation or rupture operation, a high voltage that may break a gate oxide of the c-fuse is applied to a gate G of the resistive memory element M. The high voltage is usually generated by a charge pumping method using a power source voltage greater than approximately 6V. Thus, the resistive memory element M operates as a resistor having a relatively low resistance value. When the resistive memory element M is not programmed, the resistive memory element M operates as a capacitor having a relatively high resistance value.

During a read operation, a voltage, which is appropriate for the read operation, for example, approximately 3V, is applied to the gate G of the resistive memory element M. Thus, a current path is formed through the data line DL and the load 210 from the resistive memory element M. Since the resistive memory element M has a relatively low resistance value when the resistive memory element M is programmed, a current flows through the load 210. The voltage level of the data line DL increases due to the flowing current. Since the resistive memory element M operates as a capacitor, that is, the resistive memory element M has a high resistance value when the resistive memory element M is not programmed a small current flows through the load 210. Thus, the voltage level of the data line DL is in a low state. The sense amplifier 220 generates output data DATA by comparing the voltage level of the data line DL with a reference voltage VREF.

Since enough current to sense the data flows through the data line DL, a relatively high voltage, for example, approximately 3V, has to be applied to the gate of the resistive memory element M during the read operation. Therefore, a power source voltage applied from an exterior, for example, less than approximately 1.5V, is used for the read operation by being boosted. However, the use of the high voltage brings a large burden to the read operation of the memory device. Although a voltage having a higher level, which ranges from approximately 6V to approximately 7V, has to be used during the program operation, the use of the high voltage does not bring a large burden to the program operation of the memory device since the program operation is not performed as frequently as the read operation.

SUMMARY

Various embodiments of the present invention are directed to a resistive memory device that may perform a read operation without using a high level voltage.

In accordance with an embodiment of the present invention, a resistive memory device includes: a resistive memory cell having a resistance value that varies based on a logic value of data stored therein; a current amplification block suitable for amplifying a current flowing through the resistive memory cell by N times, where N is a natural number greater than 1; and a sensing block suitable for sensing the data based on the amplified current.

In accordance with an embodiment of the present invention, a resistive memory device includes: a cell array including a plurality of resistive memory cells each having a resistive memory element and a switch element; a row control circuit suitable for applying a read voltage to memory elements of a row selected among the column lines of the cell array and electrically connecting the memory elements of the selected row with column lines by turning on switch elements of the selected row; a column control circuit suitable for electrically connecting a column line selected among the column lines of the cell array with a data line; a first current amplification block suitable for amplifying a current flowing through the data line by N times, where N is a natural number greater than 1; and a first sensing block suitable for sensing data based on the amplified current.

In accordance with an embodiment of the present invention, a resistive memory device includes: a cell array including a plurality of resistive memory cells each having a resistive memory element and a switch element; a row control circuit suitable for applying a read voltage to memory elements of a row selected among the column lines of the cell array and electrically connecting the memory elements of the selected row with column lines by turning on switch elements of the selected row; a column control circuit suitable for electrically connecting a column line selected among the column lines of the cell array with a data line; a first current amplification block suitable for amplifying a current flowing through the data line by N times, where N is a natural number greater than 1; a first sensing block suitable for sensing data based on the amplified current; a second current amplification block coupled with one column line among the column lines and suitable for amplifying a current flowing through the coupled column line by N times; and a second sensing block suitable for sensing data based on the current amplified by the second current amplification block.

DETAILED DESCRIPTION

Figure 1:
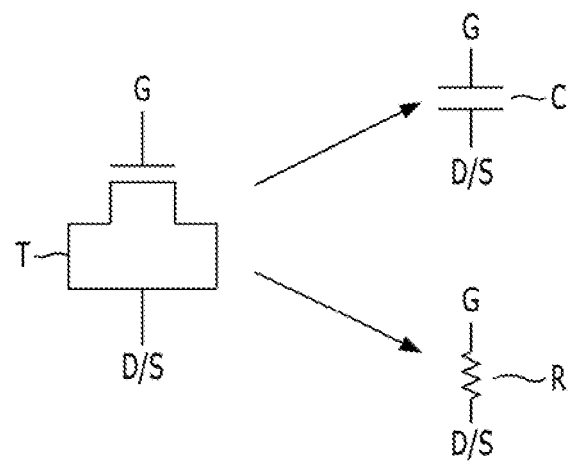
FIG. 1 is a diagram illustrating an e-fuse formed of a transistor operating as a resistor or a capacitor.
Figure 2:
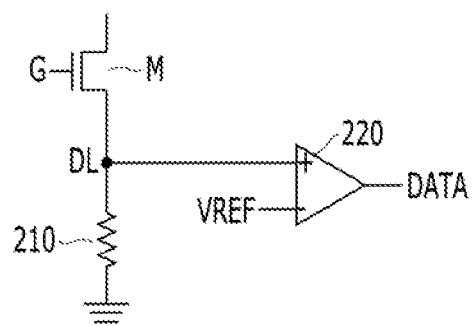
FIG. 2 is a diagram illustrating a memory device including an e-fuse.

Hereafter, exemplary embodiments of the present invention are described below in more detail with reference to the accompanying drawings. Rather, these embodiments are provided so that this disclosure is thorough and complete, and fully convey the scope of the present invention to those skilled in the art. Throughout the disclosure, like reference numerals refer to like parts throughout the various figures and embodiments of the present invention.

In the drawings, a thicknesses and length of components are exaggerated compared to actual physical thickness and intervals for convenience of illustration. In the following description, a detailed explanation of known related functions and constitutions may be omitted to avoid unnecessarily obscuring the subject manner of the present invention. Furthermore, "connected/coupled" represents that one component is directly coupled to another component or indirectly coupled through another component. In this specification, a singular form may include a plural form as long as it is not specifically mentioned in a sentence. Furthermore, "include/comprise" or "including/comprising" used in the specification represents that one or more components, steps, operations, and elements exist or are added.

Figure 3:
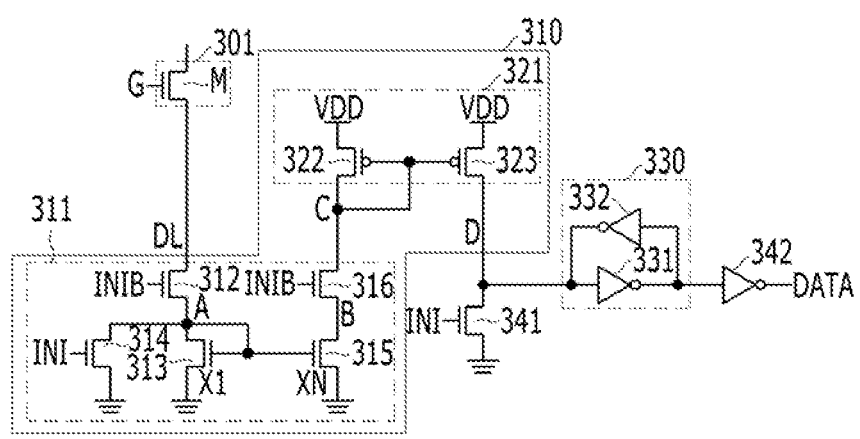
FIG. 3 is a diagram illustrating a resistive memory device in accordance with a first embodiment of the present invention.

FIG. 3 is a diagram illustrating a resistive memory device in accordance with a first embodiment of the present invention.

Referring to FIG. 3, the resistive memory device may include a resistive memory cell 301, a current amplification block 310 and a sensing block 330.

The resistive memory cell 301 may include a resistive memory element M, and the resistive memory element M may be an e-fuse element. The resistive memory element M may have a low resistance value or a high resistance value based on a logic value of data stored therein. For example, the resistive memory element M may have a low resistance value when the resistive memory element M is programmed or ruptured, by a high voltage supplied to a gate G, and the resistive memory element M may have a high resistance value when the resistive memory element M is not programmed or ruptured.

The current amplification block 310 may amplify a current flowing through the resistive memory cell 301 by N times, where N is a natural number greater than 1. The current amplification block 310 may include a first current mirror unit 311 and a second current mirror unit 321. The first current mirror unit 311 mirrors a current flowing through a data line DL by N times, which is an input line of the current amplification block 310, and the second current mirror unit 321 mirrors the current mirrored by the first current mirror unit 311 to an output line D. The first current mirror unit 311 may include a first transistor 312, a second transistor 313, a third transistor 314, a fourth transistor 315, and a fifth transistor 316. The first transistor 312 couples the data line DL with a first node A in response to an initialization signal INIB. The second transistor 313 sinks a current of the first node A in response to a voltage level of the first node A. The third transistor 314 sinks a current of the first node A in response to an initialization signal INI. The fourth transistor 315 sinks a current of a second node B in response to a voltage level of the first node A. The fifth transistor 316 couples the second node B with a third node C in response to the initialization signal INIB. The second current mirror unit 321 may include a sixth transistor 322 and a seventh transistor 323. The sixth transistor 322 sources a current to the third node C in response to a voltage level of the third node C, and the seventh transistor 323 sources a current to the output line D in response to a voltage level of the third node C. The initialization signals INI and INIB may have a logic high and a logic low level during an initialization of the resistive memory device, and a low and high level thereafter. The initialization signal INIB is a complementary signal of the initialization signal INI.

The sensing block 330 may sense data based on a current amplified by the current amplification block 310, which is a current flowing through the output line D. The sensing block 330 may include a first inverter 331 and a second inverter 332 of which input and output terminals are coupled with each other. An eighth transistor 341 may initialize data of the sensing block 330 and the third inverter 342, and output the output data DATA sensed by the sensing block 330.

A read operation of the resistive memory device is described below with reference to FIG. 3. During the initialization of the resistive memory device, the first transistor 312 and the fifth transistor 316 may be turned off, and the third transistor 314 and the eighth transistor 341 may be turned on, based on the initialization signals INI and INIB. Consequently, the first node A may be initialized to a low level, and the output line D may be initialized to a low level. After the initialization section passes, the first transistor 312 and the fifth transistor 316 may be turned on, and the third transistor 314 and the eighth transistor 341 may be turned off. A current flowing through the data line DL may be mirrored by N times by the first current mirror unit 321. That is, the amount of a current flowing through the third node C may be N times the amount of the current flowing through the data line DL. Also, the current flowing through the third node C may be mirrored to the output line D as it is by the second current mirror unit 321. As a result, the amount of a current flowing through the output line D may be N times the amount of the current flowing through the data line DL. When the amount of the current flowing through the output line D is large that is, when the resistive memory cell 301 is programmed, a voltage level of the output line D may increase and be latched by the sensing block 330 of a latch type. Thus, the output data DATA may be a logic "high" level. When the amount of the current flowing through the output line D is small, —that is, the resistive memory cell 301 is not programmed, the voltage level of the output line D may maintain a logic "low" level, which is an initialization level, and be latched by the sensing block 330 of the latch type. That is, the output data DATA may be of a logic "low" level.

In the embodiment of FIG. 3, the sensing block 330 senses data based on the current amplified by N times by the current amplification block 310, not the current flowing through the data line DL. Therefore, although a large amount of currents do not flow through the data line DL, the sensing block 330 may accurately sense data. This means that a high voltage does not need to be supplied to the gate G of the resistive memory element M during the read operation. That is, even though such a low voltage as a power source voltage, for example, approximately 1.5V, is supplied to the gate G of the memory element M during the read operation, the data stored in the memory element M may be accurately sensed.

Figure 4:
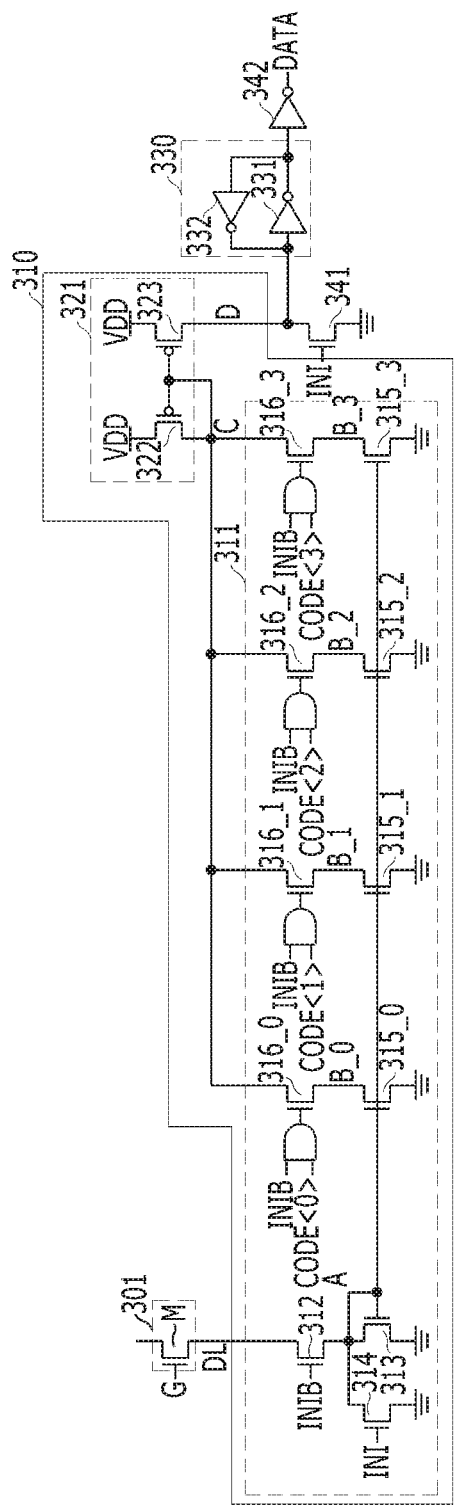
FIG. 4 is a diagram illustrating a resistive memory device in accordance with a second embodiment of the present invention.

FIG. 4 is a diagram illustrating a resistive memory device in accordance with a second embodiment of the present invention. FIG. 4 shows the current amplification block 310 capable of changing the value of the current amplification ratio N.

Referring to FIG. 4, the first current mirror unit 311 may include a plurality of fourth transistors 315_0 to 315_3, a plurality of fifth transistors 316_0 to 316_3 and a plurality of second nodes B_0 to B_3. This is the difference from the first current mirror unit 311 shown in FIG. 3 that includes one fourth transistor 315, one fifth transistor 316, and one second node B.

The fifth transistors 316_0 to 316_3 may be turned on/off based on the combination of the initialization signal INIB and a magnification control code CODE<0:3>. That is, since the initialization signal INIB has a logic "high" level, the number of the fifth transistors 316_0 to 316_3 which are turned on/off may be determined based on the value of the magnification control code CODE<0:3>. For example, two fifth transistors 316_0 and 316_1 may be turned on when the value of the magnification control code CODE<0:3> is "1, 1, 0, 0", and four fifth transistors 316_0 to 316_3 may be turned on when the value of the magnification control code CODE<0:3> is "1, 1, 1, 1".

It may be possible to control the number of the fourth transistors 315_0 to 315_3 used for mirroring the current of the data line DL to the third node C based on the number of the fifth transistors 316_0 to 316_3 which are turned on, and thus the value of the current amplification ratio N may be changed. That is, the value of the current amplification ratio N may increase as the number of the fourth transistors 315_0 to 315_3 used for mirroring the current increases.

The control function of the value of the current amplification ratio N may be applied to the read operation for verification. A gate oxide of a transistor may or may not be easily broken depending on the characteristics of the resistive memory element M. Thus, the read operation for the verification is performed and verifies whether or not the resistive memory element M is programmed properly. When the resistive memory element M is not programmed properly, that is, when the data is not, changed from "0" to "1", the resistive memory element M is programmed again. This type of read operation is referred to as a verification read operation. Since the verification read operation verifies a correct performance of the program operation, the verification read operation may be performed in more severe conditions than that of a normal read operation. Therefore, the verification operation may be performed to decrease the value of the current amplification ratio N during the verification read operation, and the verification operation may be performed to increase the value of the current amplification ratio N during the normal read operation. For example, the stability of the normal read operation may be improved when the program operation is verified by the verification read operation while the current amplification ratio is controlled by 2 times. Afterwards the normal read operation is performed while the current amplification ratio is controlled by 4 times.

Figure 5:
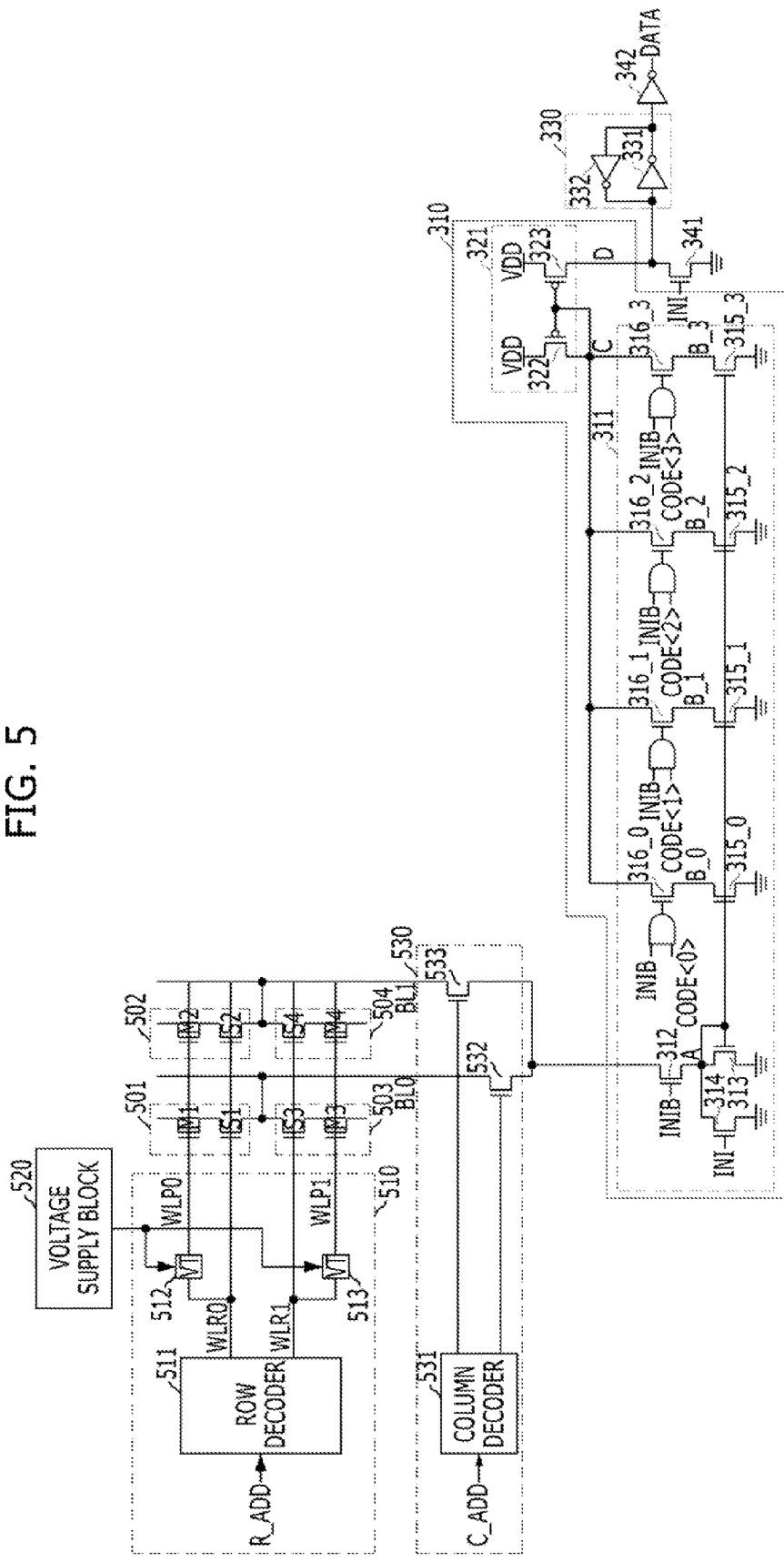
FIG. 5 is a diagram illustrating a resistive memory device in accordance with a third embodiment of the present invention.

FIG. 5 is a diagram illustrating a resistive memory device in accordance with a third embodiment of the present invention. With reference to FIG. 5, the resistive memory cell formed in a cell array is described below.

Referring to FIG. 5, the resistive memory device may include a cell array including a plurality of resistive memory cells 501, 502, 503 and 504, a row control circuit 510, a voltage supply block 520, a column control circuit 530, a current amplification block 310 and a sensing block 330.

Each of the resistive memory cells 501, 502, 503 and 504 may include resistive memory elements M1 to M4 and switch elements S1 to S4. The resistive memory elements M1 to M4 may have the characteristics of a resistor or a capacitor according to whether or not they are ruptured. The switch elements S1 to S4 may electrically connect the resistive memory elements M1 to M4 with column lines BL0 and BL1 based on the control of row lines WLR0 and WLR1. Although thousands or tens of thousands of memory cells may be included in the cell array, just four memory cells are described herein for the sake of convenience in description.

The row control circuit 510 may include a row decoder 511 and a plurality of voltage change units 512 and 513. The row decoder 511 may decode a row address R_ADD and activate one row line selected between the row lines WLR0 and WLR1 to a logic "high" level, and it may have the switch element of the corresponding row turned on. The voltage change units 512 and 513 may drive voltages of program/read lines WLP0 and WLP1 to a logic "low" level when the row lines WLR0 and WLR1 are deactivated, and it may supply a voltage from the voltage supply block 520 to the program/read lines WLP0 and WLP1 when the row lines WLR0 and WLR1 are activated.

The voltage supply block 520 may supply a high voltage for example, approximately 6V, to break a gate oxide of the e-fuses M1, M2, M3 and M4 to the voltage change units 512 and 513 during the program operation, that is, the rupture operation of the fuse. During the read and verification operations, the voltage supply block 520 may supply a voltage appropriate for the read operation to the voltage change units 512 and 513, for example, approximately 1.5V.

The column control circuit 530 may include a column decoder 531 and switches 532 and 533. The column decoder 531 may decode a column address C_ADD and control the switches 532 and 533 to couple one column line selected between the column lines BL0 and BL1 with the data line DL.

The current amplification block 310 and the sensing block 330 may sense data of the memory cell based on a current flowing through the data line DL. The current amplification block 310 and the sensing block 330 read the data of the memory cell selected based on the row address R_ADD and the column address C_ADD among the memory cells 501 to 504.

In the embodiment of FIG. 5, the resistive memory elements M1, M2, M3 and M4 are formed in an array shape, and the program and read operations are performed only on the resistive memory element selected based on the addresses R_ADD and C_ADD among the resistive memory elements M1, M2, M3 and M4. Other than that, since the resistive memory device shown in the embodiment of FIG. 5 operates in the same manner as the resistive memory devices shown in the embodiments of FIGS. 3 and 4, a detailed description is omitted herein.

Figure 6:
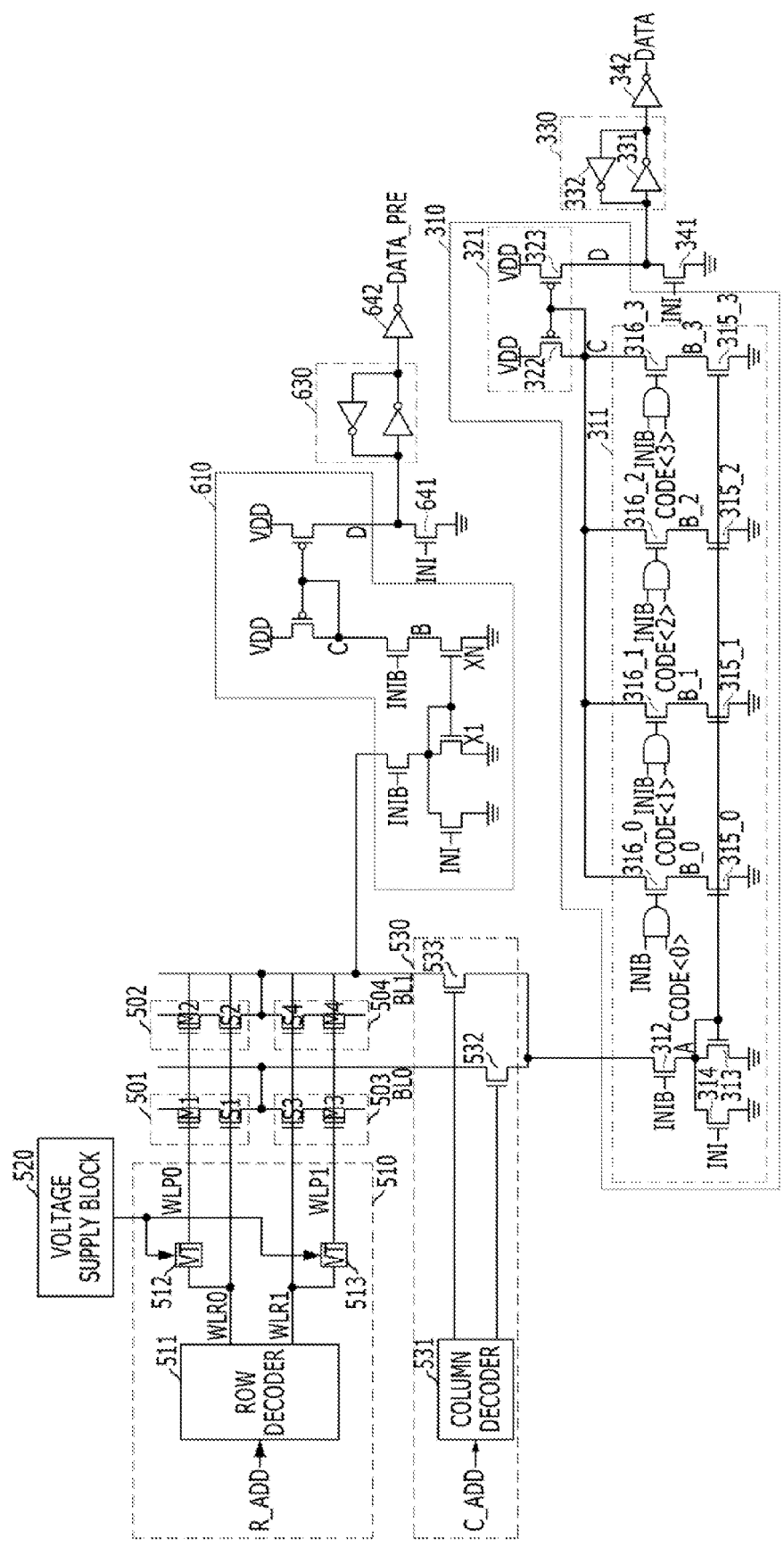
FIG. 6 is a diagram illustrating a resistive memory device in accordance with a fourth embodiment of the present invention.

FIG. 6 is a diagram illustrating a resistive memory device in accordance with a fourth embodiment of the present invention.

Referring to FIG. 6, the resistive memory device may further include a current amplification block 610 and a sensing block 630, which are directly coupled with the column line BL1.

The current amplification block 610 and the sensing block 630 may operate in the same manner as the current amplification block 310 and the sensing block 330. Furthermore, a transistor 641 corresponds to the eighth transistor 341, and an inverter 642 corresponds to the third inverter 342. However, the current amplification block 610 and the sensing block 630 may be used to sense data of the column line BL1 directly without going through the column control circuit 530.

For a normal operation of the resistive memory device, it may be necessary to set the resistive memory device properly. For example, it may be required to set various delay values of the resistive memory device and the voltage levels used by the resistive memory device first. When information required for the setting is stored in memory cells of a predetermined column line, it may be necessary to read the data of the corresponding column, by using the current amplification block 610 and the sensing block 630. For example, when the information required for the setting of the resistive memory device is stored in the memory cells corresponding to a K$^{th}$ column BLK the setting information DATA_PRE may be obtained by the current amplification block 610 and the sensing block 630, which are directly coupled with the K$^{th}$ column BLK among hundreds of columns BL0 to BLK, prior to the operation of the resistive memory device. That is, the rows corresponding to the memory cells in which the setting information is stored, may control the read operation to be sequentially performed by the row control circuit 510.

That is, the resistive memory device may further include the current amplification block 610 and the sensing block 630, which are directly coupled with a predetermined column, to read the setting information stored in the predetermined column in advance before a normal operation is performed.

In accordance with the embodiments of the present invention, a read operation of the resistive memory device may be performed with reliability without using a high level voltage.

While the present invention has been described with respect to the specific embodiments, it is noted that the embodiments of the present invention are not restrictive but descriptive. Further, it is noted that the present invention may be achieved in various ways through substitution, change, and modification, by those skilled in the art without departing from the scope of the present invention as defined by the following claims.

What is claimed is:

1. A resistive memory device, comprising:
a resistive memory cell having a resistance value that varies based on a logic value of data stored therein;
a current amplification block amplifying a current flowing through the resistive memory cell by N times, where N is a natural number greater than 1; and
a sensing block sensing the data based on the amplified current,
wherein the amplification ratio N of the current amplification block is set smaller during a verification read operation than during a normal read operation, the verification read operation being performed to verify whether, after a program operation on the resistive memory cell is performed, the resistive memory cell is programmed, and
wherein the current amplification block includes:
a first current mirror unit mirroring a current flowing through an input line by N times; and
a second current mirror unit mirroring the current mirrored by the first current mirror unit to an output line.

2. The resistive memory device of claim 1, wherein the first current mirror unit includes:
a first transistor coupling the input line with a first node based on an initialization signal;
a second transistor sinking a current of the first node based on a voltage level of the first node;
a third transistor sinking the current of the first node based on the initialization signal;
a plurality of fourth transistors sinking currents of a plurality of second nodes, respectively, based on the voltage level of the first node; and
a plurality of fifth transistors coupling the respective second nodes with a third node based on the initialization signal and a magnification control code.

3. The resistive memory device of claim 2, wherein the second current mirror unit includes:
a sixth transistor sourcing a current to the third node based on a voltage level of the third node; and
a seventh transistor sourcing a current to the output line based on the voltage level of the third node.

4. The resistive memory device of claim 1, wherein the sensing block includes:
a first inverter; and
a second inverter receiving an output of the first inverter as an input of the second inverter, and transmitting an output of the second inverter to the first inverter which receives the output of the second inverter as an input of the first inverter.

5. The resistive memory device of claim 1, wherein the resistive memory cell includes an e-fuse.

6. A resistive memory device, comprising:
a cell array including a plurality of resistive memory cells each having a resistive memory element and a switch element;
a row control circuit applying a read voltage to memory elements of a row selected among the column lines of the cell array and electrically connecting the memory elements of the selected row with column lines by turning on switch elements of the selected row;
a column control circuit electrically connecting a column line selected among the column lines of the cell array with a data line;
a first current amplification block amplifying a current flowing through the data line by N times, where N is a natural number greater than 1; and
a first sensing block sensing data based on the amplified current,
wherein the amplification ratio N of the first current amplification block is set smaller during a verification read operation than during a normal read operation, the verification read operation being performed to verify whether, after a program operation on the resistive memory cell is performed, the resistive memory cell is programmed, and wherein the first current amplification block includes:
- a first current mirror unit mirroring a current flowing through the data line by N times; and
- a second current mirror unit mirroring the current mirrored by the first current mirror unit to an output line.

7. The resistive memory device of claim 6, wherein the first current mirror unit includes:
- a first transistor coupling the data line with a first node based on an initialization signal;
- a second transistor sinking a current of the first node based on a voltage level of the first node;
- a third transistor sinking the current of the first node based on the initialization signal;
- a plurality of fourth transistors sinking currents of a plurality of second nodes, respectively, based on the voltage level of the first node; and
- a plurality of fifth transistors coupling the respective second nodes with a third node based on the initialization signal and a magnification control code.

8. The resistive memory device of claim 7, wherein the second current mirror unit includes:
- a sixth transistor sourcing a current to the third node based on a voltage level of the third node; and
- a seventh transistor sourcing a current to the output line based on the voltage level of the third node.

9. The resistive memory device of claim 6, wherein the first sensing block includes:
- a first inverter; and
- a second inverter receiving an output of the first inverter as an input of the second inverter, and transmitting an output of the second inverter to the first inverter which receives the output of the second inverter as an input of the first inverter.

10. The resistive memory device of claim 6, wherein the resistive memory element is an e-fuse.

11. A resistive memory device, comprising:
- a cell array including a plurality of resistive memory cells each having a resistive memory element and a switch element;
- a row control circuit applying a read voltage to memory elements of a row selected among the column lines of the cell array and electrically connecting the memory elements of the selected row with column lines by turning on switch elements of the selected row;
- a column control circuit electrically connecting a column line selected among the column lines of the cell array with a data line;
- a first current amplification block amplifying a current flowing through the data line by N times, where N is a natural number greater than 1;
- a first sensing block sensing data based on the amplified current;
- a second current amplification block coupled with a predetermined column line among the column lines and amplifying a current flowing through the predetermined column line; and
- a second sensing block sensing data based on the current amplified by the second current amplification block, wherein the amplification ratio N of the first current amplification block is set smaller during a verification read operation than during a normal read operation, the verification read operation being performed to verify whether, after a program operation on the resistive memory cell is performed, the resistive memory cell is programmed, and wherein the data of the predetermined column coupled with the second current amplification block is read first among the data stored in the cell array.

12. The resistive memory device of claim 11, wherein the data of the predetermined column includes setting information.

13. The resistive memory device of claim 11, wherein the second current amplification block mirrors the current flowing through the predetermined column line to amplify by said N times.

* * * * *